United States Patent [19]
Oguma et al.

[11] Patent Number: 5,875,116
[45] Date of Patent: Feb. 23, 1999

[54] LOGIC DIVISION APPARATUS

[75] Inventors: Toshio Oguma, Ebina; Osamu Tada, Hadano, both of Japan

[73] Assignee: Hitachi, Ltd., Tokyo, Japan

[21] Appl. No.: 588,236

[22] Filed: Jan. 18, 1996

[30] Foreign Application Priority Data

Jan. 19, 1995 [JP] Japan .................................. 7-006735

[51] Int. Cl.⁶ .................................................. G06F 17/50
[52] U.S. Cl. .......................................................... 364/491
[58] Field of Search .................... 395/500; 364/488–491, 364/578

[56] References Cited

U.S. PATENT DOCUMENTS

| | | | |
|---|---|---|---|
| 4,725,975 | 2/1988 | Sasoki ...................................... | 364/491 |
| 4,890,238 | 12/1989 | Klein et al. .............................. | 364/491 |
| 4,896,272 | 1/1990 | Kurosawa ................................ | 364/491 |
| 5,113,352 | 5/1992 | Finnerty ................................... | 364/490 |
| 5,513,119 | 4/1996 | Moone et al. ........................... | 364/491 |
| 5,640,327 | 6/1997 | Ting ........................................ | 364/488 |

*Primary Examiner*—Kevin J. Teska
*Assistant Examiner*—Ayni Mohamed
*Attorney, Agent, or Firm*—Fay, Sharpe, Beall, Fagan, Minnich & McKee

[57] ABSTRACT

The electronic circuits of a large-scale ASIC or logic device are assigned to a plurality of programmable chips with logic block division that enables the finished circuits to operate at appropriate timings. A logic division processing unit divides the electronic circuits into a plurality of groups for automatic assignment to a plurality of programmable chips. A checking unit determines whether the designated logic blocks are accommodated in one programmable chip, and a division processing unit determines which logic blocks are to be assigned and the order of assignment priorities when the designated logic blocks are not all accommodated in the same programmable chip.

15 Claims, 4 Drawing Sheets

| NO. | NAMES OF PROGRAMMABLE CHIPS USED AND NO. OF CHIPS | REQUIRED LOGIC SCALE (GATE COUNT) | REQUIRED NO. OF I/O PINS |
|---|---|---|---|
| 1 | CHIP A | 10 | 20 |
| 2 | CHIP B | 20 | 20 |

| DESIGNATED LOGIC BLOCKS (LAYOUT OR NETWORK INFO.) | ASSIGNED CHIP NAMES | ASSIGNED PRIORITIES |
|---|---|---|
| A1 | CHIP A | 1 |
| A2 | CHIP A | 1 |
| B1 | CHIP A | 2 |
| B2 | CHIP A | 2 |
| C1 | CHIP B | 1 |
| C2 | CHIP B | 1 |
| C3 | CHIP B | 1 |
| D1/P | CHIP B | 2 |
| d | CHIP B | 2 |
| e | CHIP B | 2 |
| f | CHIP B | 2 |

LOGIC DIVISION APPARATUS

BACKGROUND OF THE INVENTION

The present invention relates to logic division techniques for logically assigning the electronic circuits of an ASIC (application specific integrated circuit) or a logic device to programmable chips. More particularly, the invention relates to a logic division apparatus, such as a computer system or computer implemented device, and method or process which takes into consideration design efficiency and operation timing when assigning the electronic circuits of a large-scale ASIC or a logic device to a plurality of programmable chips.

For example, when the electronic circuits of a large ASIC or a logic device are to be implemented in a programmable chip allocation process, the logic scale or the number of available I/O pins of each chip sometimes makes it difficult to accommodate all logic information in a single programmable chip. In such a case, it is necessary to divide the logic information about the electronic circuits constituting the ASIC or logic device into a plurality of groups for assignment to a plurality of programmable chips.

The programmable chips for use with this invention are those fabricated under the so-called FPGA (field programmable gate-array) formula. In its basic structure, this type of programmable chip has programmable logic modules regularly laid out with wiring regions interposed therebetween. The chips are semi-custom ICs that may be programmed by the user into a logic device comprising from 2,000 to 20,000 gates.

SUMMARY OF THE INVENTION

The logic division techniques mentioned above have some disadvantages. For example, PRISM from NeoCAD Inc., of the U.S., offers logic division programs that limit the number of programmable chips to which the logic blocks are to be assigned. Because the program handles as its input file the output file of a logic synthesis system for programmable chips, it is difficult to recognize the logical relations and timing constraints between logic blocks constituting an ASIC. The resulting IC chips may not operate at the desired timings.

It is therefore an object of the present invention to provide a logic division apparatus which enhances design efficiency in assigning the electronic circuits of a large-scale ASIC or logic device to a plurality of programmable chips and which performs logic block division so that the finished circuits will operate with appropriate timing.

In carrying out the invention and according to one aspect thereof, there is provided a logic division apparatus for dividing into a plurality of groups electronic circuits constituting either an application-specific integrated circuit (ASIC) or a logic device and for automatically assigning the divided groups of electronic circuits to a plurality of programmable chips. The logic division apparatus has assigning means for receiving first and second information, the first information representing the number of I/O pins to be accommodated in each of the programmable chips and the logic scale thereof, the second information designating logic blocks desired to be assigned to the same programmable chip. Given the first and the second information, the assigning means assigns the logic blocks to the same programmable chip accordingly.

In a preferred structure according to the invention, the assigning means includes judging means for checking to see if the logic blocks designated beforehand are accommodated in a single programmable chip, and determining means used if the designated logic blocks are not all accommodated in the single programmable chip. The determining means determines the logic blocks to be accommodated in the order of assignment priority as specified in the second information.

In a further preferred structure according to the invention, the second information designating the logic blocks desired to be assigned to the same programmable chip is composed of one of two kinds of information: layout information about the layout of the logic blocks constituting the electronic circuits of either the application-specific integrated circuit or the logic device, or network information about networks (connections) spanning the logic blocks which should belong to the same group of electronic circuits constituting either the application-specific integrated circuit or the logic device. With this structure utilizing the network information, the assigning means may assign the logic blocks to the same programmable chip according to the number of networks spanning the logic blocks belonging to the same group of electronic circuits. Alternatively, the assigning means may assign the logic blocks to the same programmable chip by giving priority either to source-side or to sink-side logic blocks with respect to the direction of logic flow between the groups.

The logic division apparatus has the assigning means for assigning logic blocks to a plurality of programmable chips in accordance with the first and the second information, the first information representing the number of I/O pins to be accommodated in each of the programmable chips and the logic scale thereof, the second information designating the logic blocks desired to be assigned to the same programmable chip. Thus in assigning the electronic circuits of a large-scale ASIC or logic device to a plurality of programmable chips, the assigning means can assign the desired logic blocks to the same programmable chip required on the basis of the first and the second information.

Before actually dividing the electronic circuits, the inventive apparatus is provided with the information about the number of I/O pins of each of the programmable chips and the logic scale thereof, i.e., information which will be used in the logic division processing. This makes it possible to assign logic blocks to a plurality of programmable chips efficiently and in a way that ensures the eventual operation of the finished circuits at desired timings.

In actually assigning the logic blocks to programmable chips, the inventive apparatus and process can refer to the information about the layout of the logic blocks involved. This allows the apparatus to give priority to the logic blocks located close to one another so that the appropriate logic blocks will go into the same programmable chip with sufficient consideration to location-induced signal delay timings.

By utilizing the information about networks spanning the logic blocks, the apparatus may preferentially assign appropriate logic blocks to the same programmable chip with priority based on an order established by the number of networks spanning these logic blocks. Alternatively, the apparatus may preferentially assign suitable logic blocks to the same programmable chip by giving priority either to source-side or to sink-side logic blocks. In this manner, it is easy to assign the logic blocks to the same programmable chip in accordance with the networks involved.

When the electronic circuits of a large-scale ASIC or logic device being designed and developed are to be assigned to a plurality of programmable chips, the invention takes into consideration the design efficiency and operation timing of the chips. By enhancing in this manner the efficiency of chip design and development, the apparatus permits logic division of the electronic circuits into the chips to enable optimum timing performance.

DETAILED DESCRIPTION OF THE PREFERRED EMBODIMENTS

One preferred embodiment will now be described with reference to the accompanying drawings.

Figure 1:
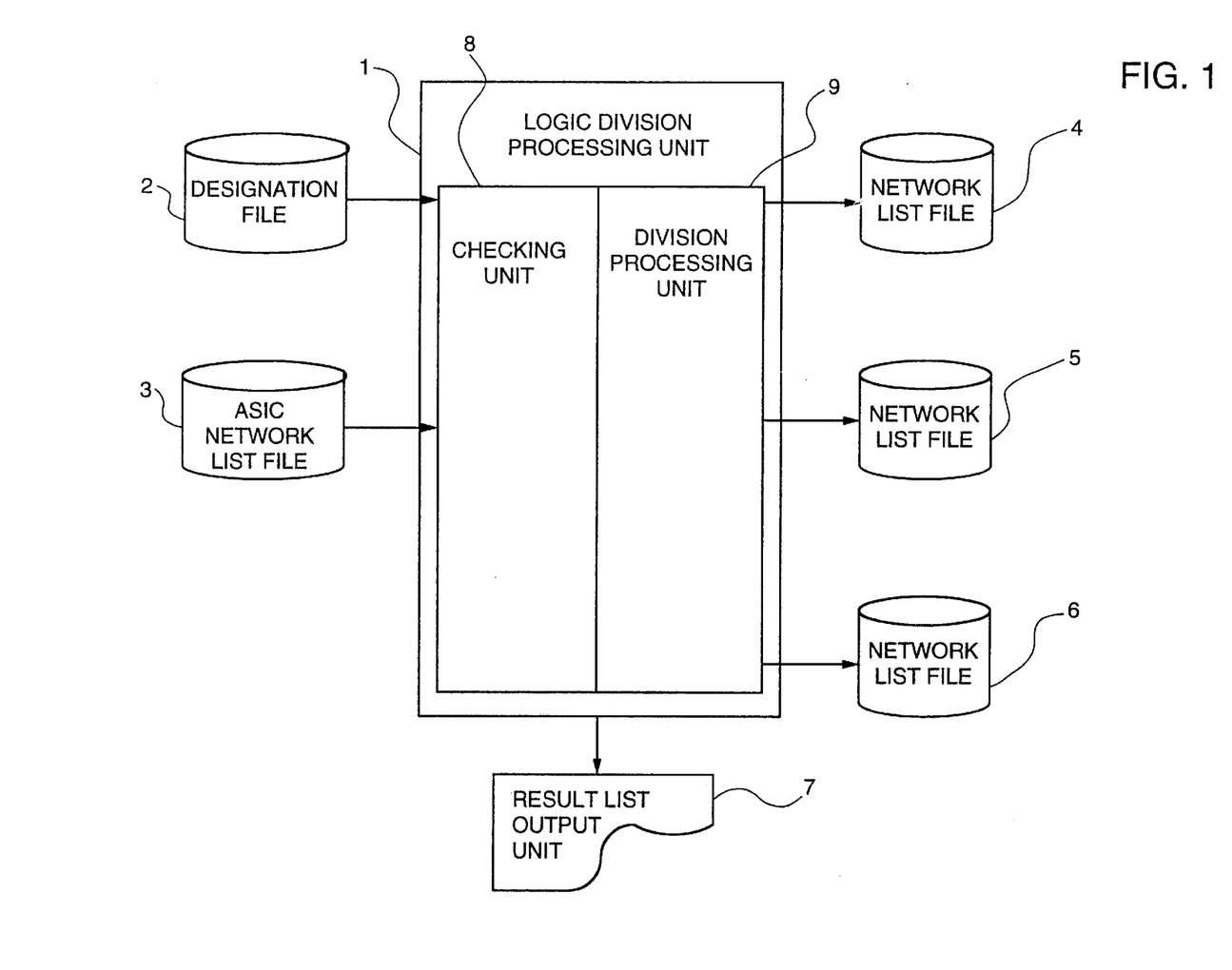
FIG. 1 is a block diagram of a logic division apparatus practiced as the preferred embodiment of the invention.
Figure 2:
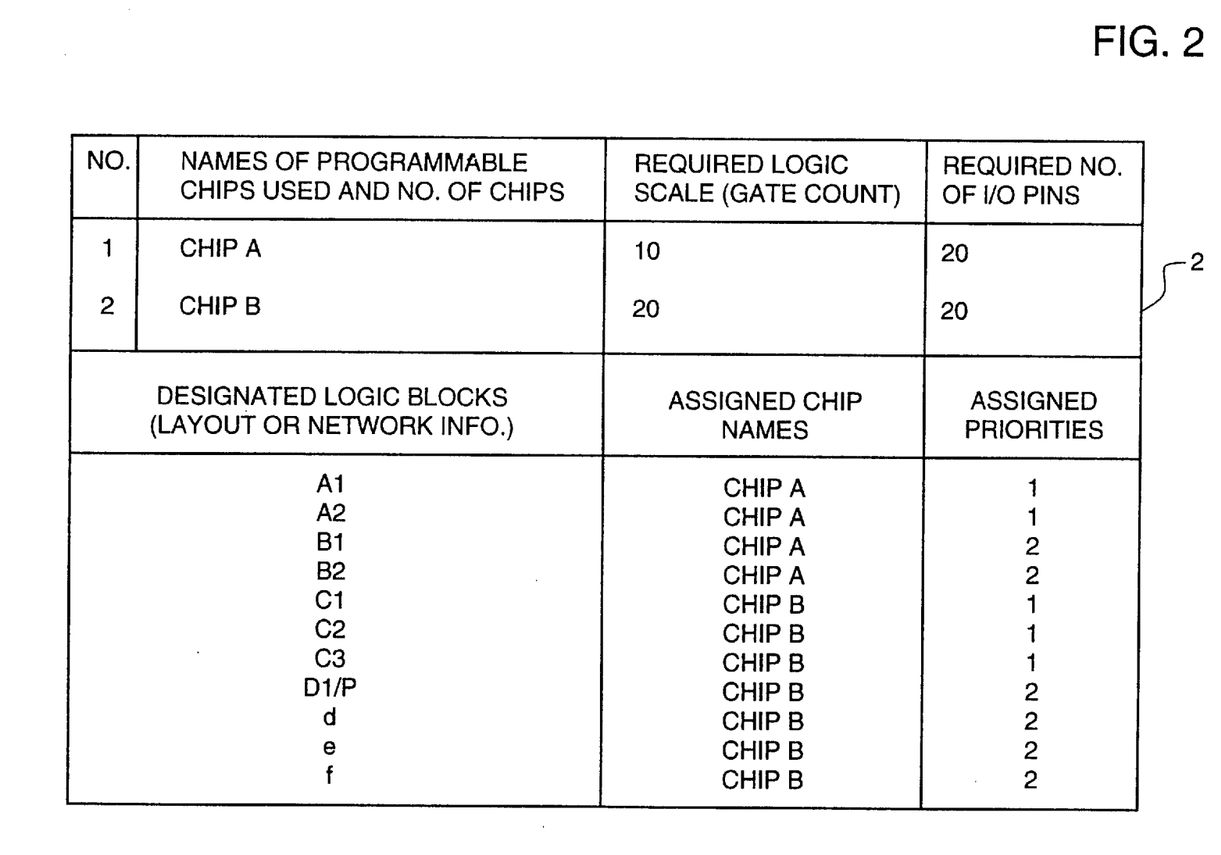
FIG. 2 is a table listing a typical designation file for use with the embodiment.
Figure 3:
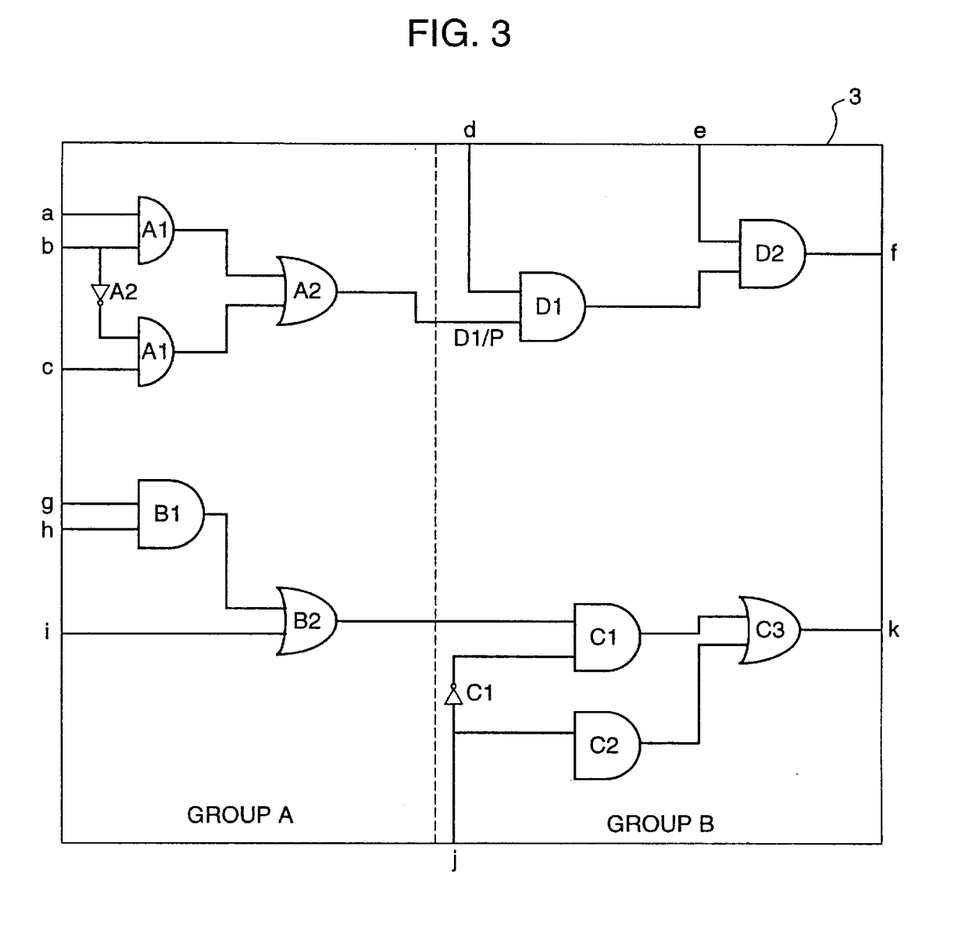
FIG. 3 is a schematic view depicting information in the ASIC network list file for use with the embodiment.
Figure 4:
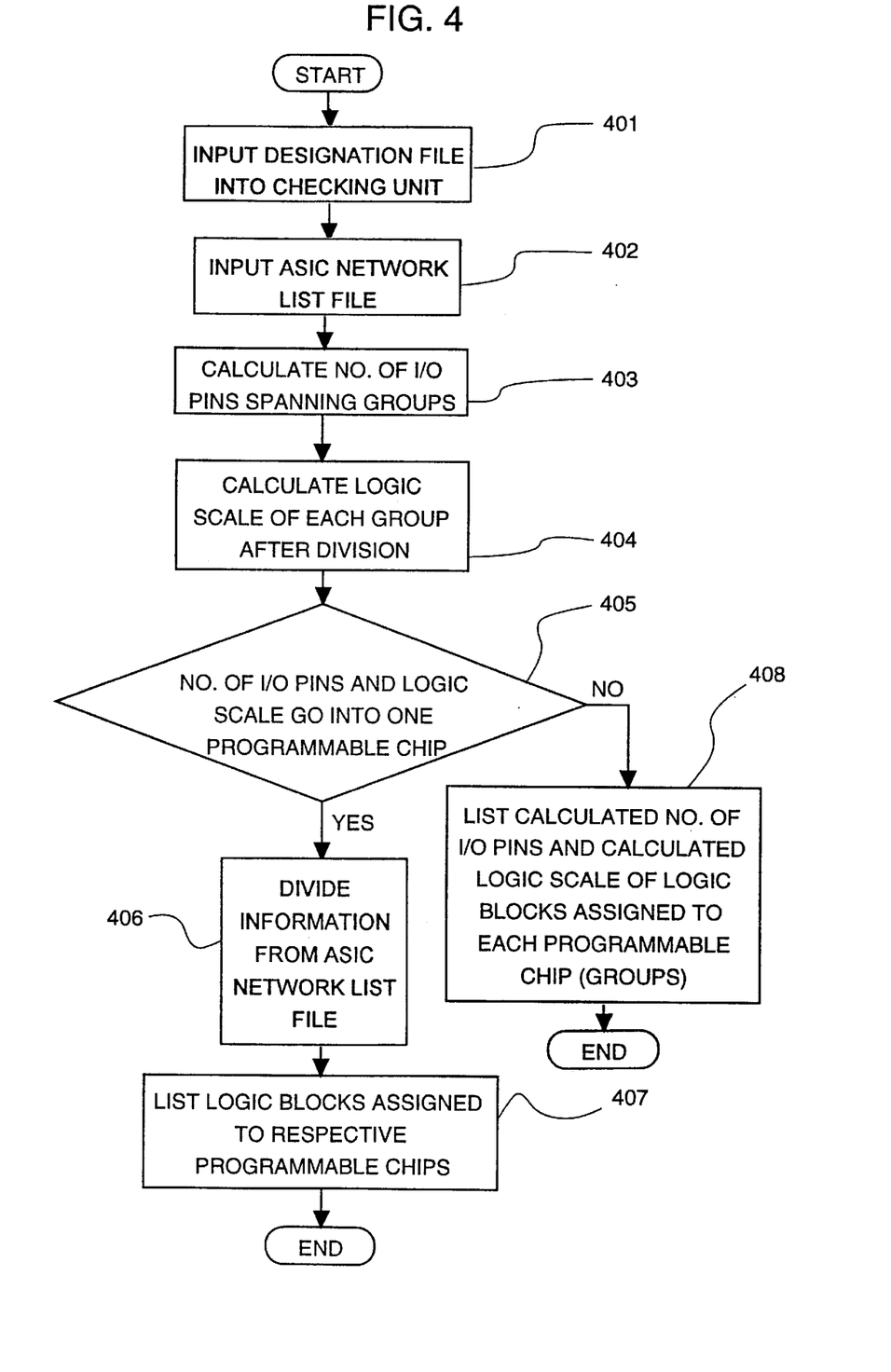
FIG. 4 is a flowchart of steps followed in implementing the functions performed by the logic division processing according to the preferred embodiment of the invention.

FIG. 1 is a block diagram of a logic division apparatus according to a preferred embodiment of the invention with which the method or process of the invention can be practiced. FIG. 2 is a table listing a designation file for use with the embodiment. FIG. 3 is a schematic view depicting information in an ASIC network list file. FIG. 4 is a flowchart of steps followed in implementing logic division performed according to the invention.

The logic division practiced according to the preferred embodiment of the invention is used to logically divide the electronic circuits of an ASIC or logic device into a plurality of groups. The apparatus comprises a combination of computer hardware, software and peripherals, for example a computer system including a computer having memory for storage of program code, for example a hard disk. Various functions are performed by units of the system, such as a logic division processing unit 1 (assigning means) and a result list output unit 7. The system also includes a designation file 2, an ASIC network list file 3, and network list files 4 through 6.

The logic division processing unit 1 automatically assigns the divided groups of electronic circuits to a plurality of programmable chips. The designation file 2 and ASIC network list file 3, which can be computer files stored in memory, accommodate information to be input to the logic division processing unit 1. The network list files 4 through 6, which can also be computer files stored in memory, store information to be output from the logic division processing unit 1. The result list output unit 7 outputs the result of the logic division processing.

Given the information from the designation file 2 and ASIC network list file 3, the logic division processing unit 1 assigns suitable logic blocks to the same programmable chip. The assigning of the logic blocks is performed in accordance with the number of available I/O pins and the logic scale (number of gates) of each programmable chip as well as according to the logic blocks desired to be assigned by the designer or user of the apparatus to a particular chip. After logic block assignment, the logic division processing unit 1 outputs assignment information about each programmable chip. The logic division processing unit 1 includes a checking unit 8 (judging means) and a division processing unit 9 (determining means). The functions of these units may be implemented by a computer.

The checking unit 8 receives from the designation file 2 two kinds of information: information about the number of I/O pins to be accommodated in each of a plurality of programmable chips and the logic scale thereof, and information designating the logic blocks desired to be assigned to the same programmable chip. Given the information, the checking unit 8 checks to see if the designated logic blocks are accommodated in a given programmable chip. The check by the checking unit 8 is carried out before the actual logic division processing takes place.

When the check by the checking unit 8 reveals that the designated logic blocks are not all accommodated in a single programmable chip, the division processing unit 9 determines which of the blocks that are to be accommodated in the order of assignment priority. If all of the designated logic blocks are found to be able to be accommodated in the same programmable chip, the logic blocks are determined by the division processing unit 9 to be assigned according to the received information input by the designer before logic division processing is executed. The division processing unit 9 outputs the result of the logic division processing to the network list files 4 through 6 on each programmable chip.

The designation file 2 is preferably maintained on a computer accessible storage medium that stores such information as the number of I/O pins in each of the programmable chips needed for logic division processing, the logic scale of each chip, and the priorities of the logic blocks to be assigned preferentially. This information is input by the designer beforehand. Illustratively, as shown in FIG. 2, the designation file 2 includes the names and the number of the programmable chips that the designer intends to use, the logic scale of each of the programmable chips, and the number of I/O pins accommodated in each chip. In this example, two programmable chips, chip A and chip B, are used. Each programmable chip may have a maximum logic scale of 10 gates. The maximum number of I/O pins in each programmable chip is 20, according to this example.

The designation file 2 also includes information in accordance with which to assign certain logic blocks preferentially to a certain programmable chip. The preferential assigning of logic blocks results in the logic blocks (e.g. A1, A2 having assigned priority 1) having higher priority being assigned to a specific programmable chip (represented by a group name), before logic blocks (e.g. B1, B2 having an assigned priority of 2) are assigned to the specific chip.

In the example of FIG. 2, such logic blocks as A1, A2, B1 and B2 are designated as specific blocks with priorities assigned as shown by the designer. The designer indicates which logic blocks should be assigned to which chips, based on different levels of priority, such as levels 1, 2 and so forth. Logic blocks having assigned priority 1 are desired to be the first ones to be put on the assigned chip of the indicated name, followed by the logic blocks having the assigned priority of 2, 3, etc. if they can be accommodated. If any logic block cannot be put on the desired chip, it is assigned to the next chip. The designated blocks constitute layout information illustratively representing ASIC cells.

In the designation file 2, such symbols as D1/P, d, e and f denote network information comprising networks spanning the programmable chips (groups) involved. Such network names that are specified to extend across programmable chips may be referenced in order to assign preferentially certain logic blocks to the desired programmable chip if the designated logic blocks are not all accommodated in one chip.

The assignment priorities are determined illustratively in accordance with the network information. That is, appropriate logic blocks are preferentially assigned to the same programmable chip in an order depending on the number of networks spanning these logic blocks. Alternatively, suitable logic blocks may be preferentially assigned by the designer to the same programmable chip by giving priority either to the source-side or to the sink-side logic blocks with respect to the direction of the logic flow between the groups.

The ASIC network list file 3 is a file that describes circuit connection information and layout information about the electronic circuits of an ASIC or logic device. Illustratively, as depicted in FIG. 3, the file may describe two logically divided chips, i.e., programmable chips A and B representing groups A and B in an ASIC having logic circuits connected with single logic functions such as AND, OR and NOT gates. The left side of the dashed line represents the source side whereas the left side thereof represents the sink side because the logic flow is presumed to be from left to right as shown in the figure. Each of the logic blocks A1, A2, B1, B2, C1, C2 and C3 may represent one or more gates. Of the signals listed in the layout information, signal D1/P represents an interconnection between two groups, as shown in FIG. 3, that spans the two groups A and B. The other signals d, e, f are I/O connections that do not span the two groups A and B.

The network list files 4 through 6 are each a file that stores network information about each of the logically divided programmable groups (chips). With this embodiment, the network information on the programmable chip A is output to the network list file 4, and the network information on the programmable chip B is output to the network list file 5. The information about the networks spanning the programmable chips A and B, for example network D1/P, is determined from files 4 and 5 and output to the network list file 6.

The result list output unit 7, which may be a CRT, printer or other peripheral device, outputs a listing of the result of logical division processing. Specifically, when the check by the checking unit 8 in the logic division processing unit 1 reveals that the designated logic blocks are all accommodated in one programmable chip, the result list output unit 7 outputs the logic blocks assigned to their respective programmable chips. If the designated logic blocks are not all accommodated in a single programmable chip, the result list output unit 7 outputs information about the calculated number of I/O pins and calculated logic scale for each of the programmable chips in order to determine which logic blocks are to be assigned to which chip in the order of block assignment priorities.

A preferred embodiment of implementing the invention through hardware and/or software using a computer is described in the flow chart of FIG. 4. The functions performed by the checking unit 8 and division processing unit 9 in the logic division processing unit 1 are described with reference to FIGS. 1, 2 and 3. For this embodiment, it is assumed that the ASIC having the logic circuits of FIG. 3 is to be divided logically into two programmable chips A and B, as shown in FIG. 2.

The checking unit 8 reads information from the designation file 2 and ASIC network list file 3. Given the information, the checking unit 8 calculates the number of I/O pins and the logic scale for each of the programmable chips A and B. The checking unit 8 then checks to see if the designated logic blocks are all accommodated in a single programmable chip A.

If the result of the check reveals that the designated logic blocks do not fall within one programmable chip A, the excess logic blocks are assigned to the other programmable chip B in accordance with the designated priorities of logic block assignment. The excess logic blocks assigned to the programmable chip B have the priorities lower than those of the blocks assigned to the chip A. For logic block assignment to the programmable chip B, the checking unit 8 calculates the number of I/O pins and the logic scale of the excess logic blocks to see if the excess logic blocks all go into the chip B.

If the check by the checking unit 8 shows that the number of I/O pins and the logic scale of the remaining logic blocks allow these blocks to be accommodated in the programmable chip B, the division processing unit 9 carries out its processing. If it is found that the excess logic blocks do not all go into the programmable chip B, the division of the ASIC network list file 3 is not carried out. In that case, the calculated number of I/O pins and calculated logic scale of the logic blocks for each of the programmable chips A and B are listed for output, and the processing is terminated.

The division processing unit 9 performs its processing after the check by the checking unit 8 has revealed that the designated logic blocks are all accommodated in each of the programmable chips A and B. In the example of FIG. 2, the logic scale and the number of I/O pins for each of the programmable chips A and B are arranged to be less than those of the ASIC in question. That is, the designated logic blocks may be accommodated in the two programmable chips A and B.

According to the information from the designation file 2, the division processing unit 9 divides the information received from the ASIC network list file 3, and outputs the divided information to the two network list files 4 and 5 about the programmable chips A and B and to the network list file 6 about the networks spanning the programmable chips A and B.

In accordance with the designated assignments to the programmable chips A and B, the network list file 4 receives network information about the programmable chip A; the network list file 5 is given network information about the programmable chip B; and the network list file 6 is supplied with network information about the networks (for example, D1/P) spanning the programmable chips A and B. Thereafter, the logic blocks assigned to the programmable chips A and B are listed for output, and the processing is terminated.

The logic division processing according to the invention is implemented on a computer, for example, in accordance with the flow of steps shown in the flowchart of FIG. 4.

In steps 401 and 402, the designation file 2 and the ASIC network list file 3 are input respectively. The designation file 2 designates the names and the number of the programmable chips used, the logic scale of each of the programmable chips, the number of I/O pins required of each chip, the logic blocks to be assigned preferentially to a certain programmable chip (representing a group name), and the priorities of the logic blocks to be reassigned where the designated logic blocks are not all accommodated in the desired programmable chip. The ASIC network list file 3 contains network and layout information pertaining to the ASIC in question.

After the input of the files, the logic blocks are assigned to the programmable chips according to the designation file 2. In step 403, the number of I/O pins spanning the programmable chips (groups) involved is calculated. In step 404, the logic scale (number of gates) of the logic blocks divided into the programmable chips (groups) is calculated. In step 405, the calculated data is compared with the number of I/O pins to be accommodated in a particular programmable chip and the logic scale thereof. Thus a check is made to see if the designated logic blocks are all accommodated in the same programmable chip.

If the check in step 405 shows that the designated logic blocks can all be accommodated on the same programmable chip, step 406 is reached. In step 406, the ASIC network list file 3 is divided. In step 407 that follows step 406, the logic blocks assigned to their respective programmable chips are listed for output. If it is found that the designated logic blocks do not fall within the same programmable chip, step 408 is reached. In step 408, the calculated number of I/O pins and calculated logic scale (number of gates) of the logic blocks assigned to each of the programmable chips (groups) are listed for output, and the logic processing by the logic division apparatus comes to an end.

As described, the logic division apparatus embodying the invention comprises the logic division processing unit 1 including the checking unit 8 and division processing unit 9. The checking unit 8 checks to see if the designated logic blocks are all accommodated in one programmable chip. Given the result of the check, the division processing unit 9 determines the suitable logic blocks and performs logic division processing. This setup makes it possible to assign the electronic circuits of an ASIC or logic device to the desired programmable chips through the use of appropriate logic blocks, layout information or network information. The invention is particularly effective where the desired logic blocks of a large-scale ASIC or logic device are assigned as needed to the desired programmable chips. In such a case, the circuits constituting the logic device are logically divided efficiently in the stage of design and development, with the finished circuits operating at desired timings.

Although a preferred embodiment of the invention has been disclosed by way of the specific example give herein, the description above should not be construed as limiting the scope of the invention but as merely providing illustrations of the presently preferred embodiment. It is evident that many alternatives, modifications and variations will become apparent to those skilled in the art in light of the foregoing description.

For example, although the above-described embodiment of the invention divides logically into two chips (programmable chips A and B) the logic circuits connected with single logic functions incorporated in an ASIC, this example is merely illustrative of the invention, and in practice many circuits are composed of a plurality of logic gates and sequence circuits. The invention is also applied extensively to such circuit constitutions.

The information about the priorities of the logic blocks to be assigned preferentially may be prepared alternatively in accordance with timing constraints on logic synthesis or by use of information for designating critical paths.

In assigning the electronic circuits of a large-scale ASIC or logic device to a plurality of programmable chips, the apparatus and method of the invention designates the desired logic blocks as needed to the same programmable chip. Because the number of I/O pins and the logic scale of each of the chips are known before actual logic division is carried out, the circuits of the target logic device may be logically divided efficiently, with the finished circuits operating at the desired timings.

In addition, the apparatus and method of the invention may preferentially assign to the same programmable chip the logic blocks located close to one another by use of logic block layout information stored in file 2. This makes it possible to take into account the timing-related constraints such as location-induced signal delay times at the time of logic block assignment to the same programmable chip.

Using the information about the networks spanning the logic blocks, the logic division apparatus of the invention may preferentially assign appropriate logic blocks to the same programmable chip in the order of the number of networks spanning these logic blocks. Alternatively, the apparatus may preferentially assign suitable logic blocks to the same programmable chip by giving priority either to source-side or to sink-side logic blocks. It is thus easy to assign the logic blocks to the same programmable chip in accordance with the logic block networks involved.

As a result, the invention provides the logic division apparatus for assigning the electronic circuits of a large-scale ASIC or logic device to a plurality of programmable chips as earlier as in the stage of device design and development. The design and operation timings of the circuits involved are considered in such a manner that ensures a high level of design efficiency and optimum timings desired.

We claim:

1. A logic division apparatus for dividing into a plurality of groups electronic circuits of an application-specific integrated circuit or a logic device and for automatically assigning the divided groups of electronic circuits to a plurality of programmable chips, comprising:

assigning means for receiving first and second information, the first information representing the number of I/O pins to be accommodated in each of said programmable chips and the logic scale thereof, and the second information designating logic blocks desired by a user to be assigned to the same programmable chip, means for deriving a necessary number of I/O pins for said logic blocks that are designated by a user to be assigned to the same programmable chip, and said assigning means further assigning said logic blocks to a same one of said programmable chips when a number of I/O pins derived by the deriving means is equal to or smaller than the number of I/O pins in the first information.

2. A logic division apparatus for dividing into a plurality of groups electronic circuits of an application-specific integrated circuit or a logic device and for automatically assigning the divided groups of electronic circuits to a plurality of programmable chips, comprising:

assigning means for receiving first and second information, the first information representing the number of I/O pins to be accommodated in each of said programmable chips and the logic scale thereof, and the second information designating logic blocks desired by a user to be assigned to the same programmable chip, said assigning means further assigning said logic blocks to a same one of said programmable chips in accordance with said first and said second information, wherein said assigning means includes judging means for judging whether logic blocks designated to be accommodated in a single programmable chip by a user are able to be accommodated in said single programmable chip, and determining means used if the designated logic blocks are judged to not be all accommodated in said single programmable chip, said determining means determining which of the logic blocks are to be accommodated in said single programmable chip in the order of assignment priority as specified in said second information.

3. A logic division apparatus according to claim 2, wherein said second information designating the logic blocks desired to be assigned to said single programmable chip is composed of layout information about the layout of the logic blocks.

4. A logic division apparatus according to claim 2, wherein said second information designating the logic blocks desired to be assigned to said single programmable chip is composed of network information about networks spanning the logic blocks which should belong to the same group of said electronic circuits.

5. A logic division apparatus according to claim 4, wherein, in accordance with said network information, said assigning means assigns the logic blocks to said programmable chips according to a priority based on the number of networks spanning the logic blocks belonging to a same one of the groups of said electronic circuits.

6. A logic division apparatus according to claim 4, wherein, in accordance with said network information, said assigning means assigns the logic blocks to said same one of said programmable chips by giving priority either to source-side or to sink-side logic blocks with respect to a logic flow direction between said groups.

7. A logic division method of dividing into a plurality of groups electronic circuits of an application-specific integrated circuit or a logic device and for automatically assigning the divided groups of electronic circuits to a plurality of programmable chips, comprising:

inputting and storing first and second information, the first information representing the number of I/O pins to be accommodated in each of said programmable chips and the logic scale thereof, and the second information designating logic blocks desired by a user to be assigned to the same programmable chip;

deriving a necessary number of I/O pins for said logic blocks that are designated by a user to be assigned to the same programmable chip; and assigning said logic blocks to a same one of said programmable chips when a number of I/O pins derived by the deriving step is equal to or smaller than the number of I/O pins in the first information.

8. A logic division method of dividing into a plurality of groups electronic circuits of an application-specific integrated circuit or a logic device and for automatically assigning the divided groups of electronic circuits to a plurality of programmable chips, comprising:

inputting and storing first and second information, the first information representing the number of I/O pins to be accommodated in each of said programmable chips and the logic scale thereof, and the second information designating logic blocks desired by a user to be assigned to the same programmable chip; and assigning said logic blocks to a same one of said programmable chips in accordance with said first and said second information, wherein said assigning includes judging whether logic blocks designated to be accommodated in a single programmable chip by a user are able to be accommodated in said single programmable chip, and determining, if the designated logic blocks are judged to not be all accommodated in said single programmable chip, which of the logic blocks are to be accommodated in said single programmable chip in the order of assignment priority as specified in said second information.

9. A logic division method according to claim 8, wherein said second information designating the logic blocks desired to be assigned to said single programmable chip is composed of layout information about the layout of the logic blocks.

10. A logic division method according to claim 8, wherein said second information designating the logic blocks desired to be assigned to said single programmable chip is composed of network information about networks spanning the logic blocks which should belong to the same group of said electronic circuits.

11. A logic division method according to claim 10, wherein, in accordance with said network information, said assigning assigns the logic blocks to said programmable chips according to a priority based on the number of networks spanning the logic blocks belonging to a same one of the groups of said electronic circuits.

12. A logic division apparatus according to claim 10, wherein, in accordance with said network information, said assigning means assigns the logic blocks to said same one of said programmable chips by giving priority either to source-side or to sink-side logic blocks with respect to a logic flow direction between said groups.

13. A logic division system for dividing electronic circuits of an application-specific integrated circuit or a logic device into a plurality of groups and for automatically assigning the divided groups of electronic circuits to a plurality of programmable chips, comprising:

first storing means for storing first information concerning characteristics of said programmable chips, including a number of I/O pins for each of said programmable chips and a logic scale thereof;

second storing means for storing second information designating logic blocks desired by a user to be assigned to same ones of said programmable chips;

assigning means receiving said first and second information and assigning said logic blocks to a same one of said programmable chips in accordance with said first and said second information; and means for determining a number of network connections respectively spanning said divided groups, wherein said assigning means assigns said logic blocks to a single one of programmable chips in accordance with said determined number of network connections.

14. A logic division system for dividing electronic circuits of an application-specific integrated circuit or a logic device into a plurality of groups and for automatically assigning the divided groups of electronic circuits to a plurality of programmable chips, comprising:

first storing means for storing first information concerning characteristics of said programmable chips, including a number of I/O pins for each of said programmable chips and a logic scale thereof;

second storing means for storing second information designating logic blocks desired by a user to be assigned to same ones of said programmable chips;

assigning means receiving said first and second information and assigning said logic blocks to a same one of said programmable chips in accordance with said first and said second information; and means for calculating a number of I/O pins spanning each of said divided groups and means for judging whether designated ones of said logic blocks can be accommodated by respective ones of said programmable chips by comparing said calculated number of I/O pins with said stored number of I/O pins.

15. A logic division system for dividing electronic circuits of an application-specific integrated circuit or a logic device into a plurality of groups and for automatically assigning the divided groups of electronic circuits to a plurality of programmable chips, comprising:

first storing means for storing first information concerning characteristics of said programmable chips, including a number of I/O pins for each of said programmable chips and a logic scale thereof;

second storing means for storing second information designating logic blocks desired by a user to be assigned to same ones of said programmable chips;

assigning means receiving said first and second information and assigning said logic blocks to a same one of said programmable chips in accordance with said first and said second information; and means for calculating the logic scale of each of said divided groups and means for judging whether designated ones of said logic blocks can be accommodated by respective ones of said programmable chips by comparing said calculated logic scale with said stored logic scale.

* * * * *